United States Patent [19]

Stein

[11] 4,172,279
[45] Oct. 23, 1979

[54] INTEGRATED CURRENT SUPPLY CIRCUITS

[75] Inventor: Karl U. Stein, Munich, Fed. Rep. of Germany

[73] Assignee: Siemens Aktiengesellschaft, Berlin & Munich, Fed. Rep. of Germany

[21] Appl. No.: 825,147

[22] Filed: Aug. 16, 1977

[30] Foreign Application Priority Data

Aug. 24, 1976 [DE] Fed. Rep. of Germany ....... 2638045

[51] Int. Cl.² .............................................. H02M 7/00
[52] U.S. Cl. ................................................. 363/147
[58] Field of Search ......................... 307/279; 363/147

[56] References Cited

U.S. PATENT DOCUMENTS 3,798,529  3/1974  Jones ................................ 363/147 X

OTHER PUBLICATIONS

*Electronic Devices & Circuits*, J. Millman et al., McGraw-Hill, Inc., 1967, pp. 418–421.

Primary Examiner—William M. Shoop
Attorney, Agent, or Firm—Hill, Van Santen, Steadman, Chiara & Simpson

[57] ABSTRACT

Current supply circuits are disclosed in which a capacitive or an ohmic voltage divider is provided, and in which, except for the filter capacitor, the rectifier circuit, the smoothing circuit, and the load circuit are integrated on a semiconductor chip.

14 Claims, 11 Drawing Figures

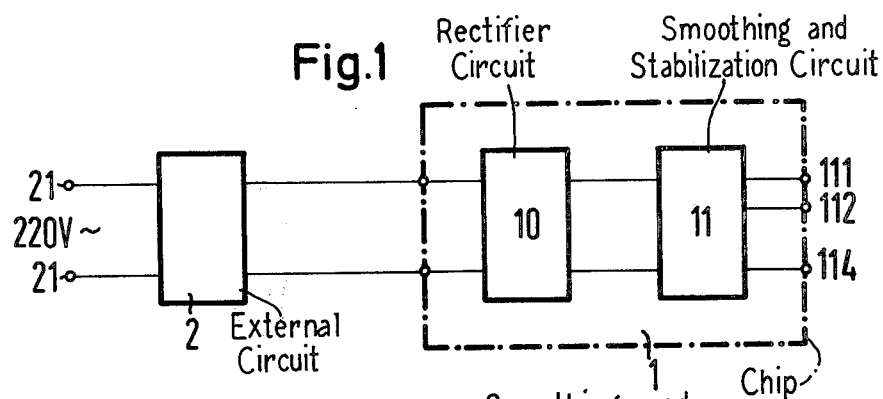
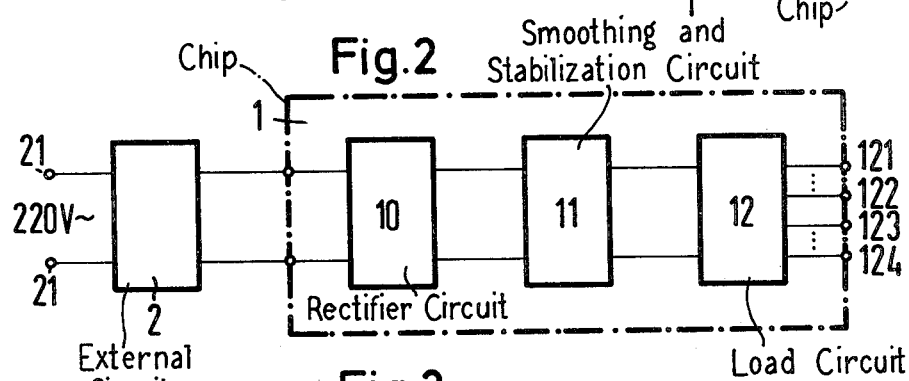
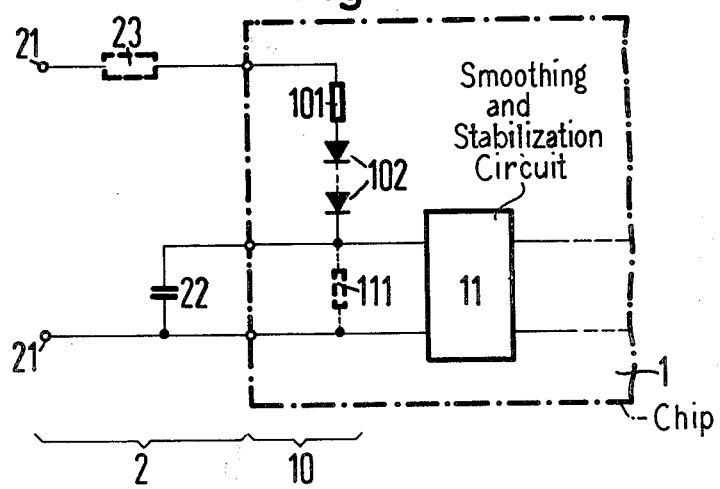

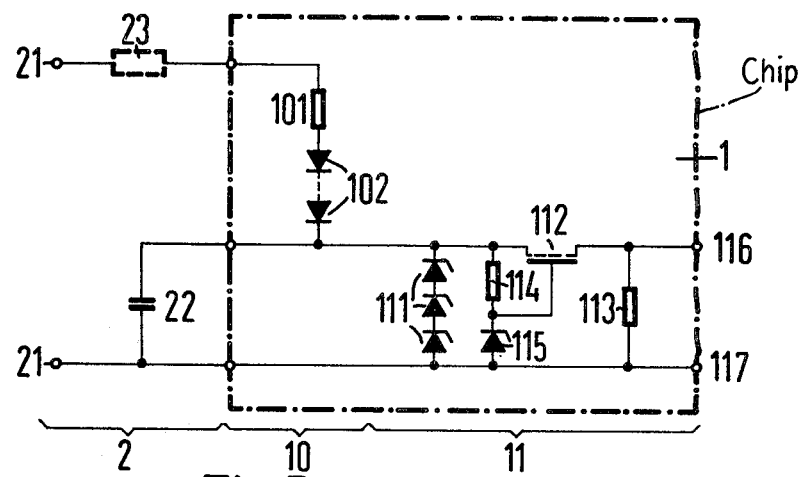
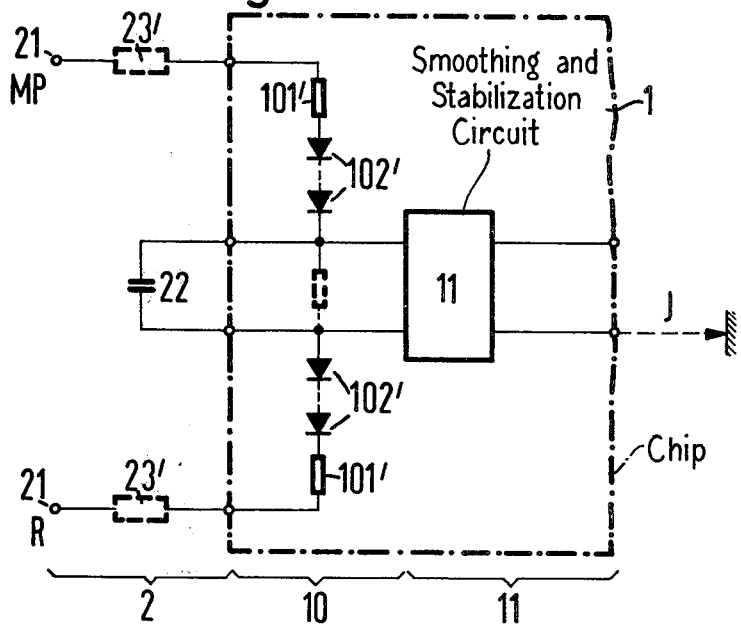

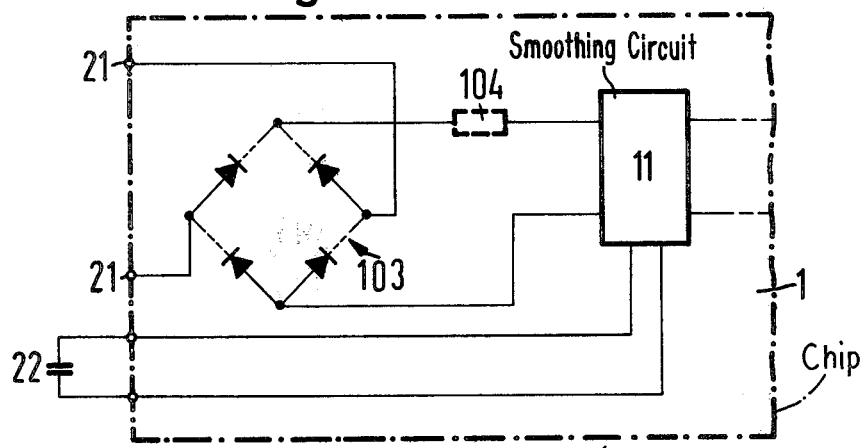
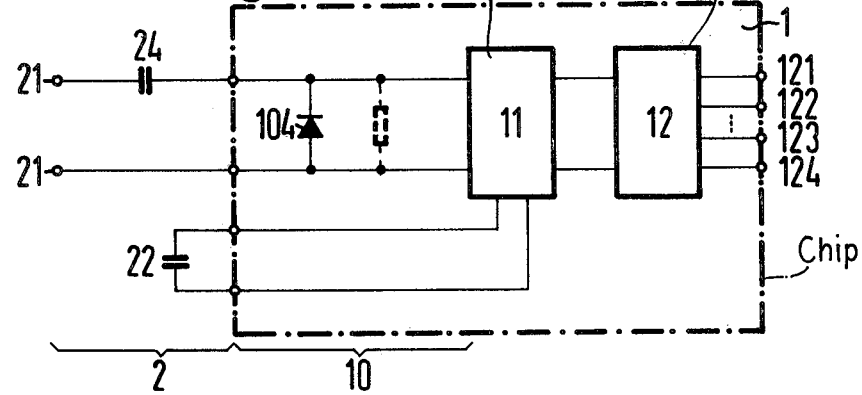
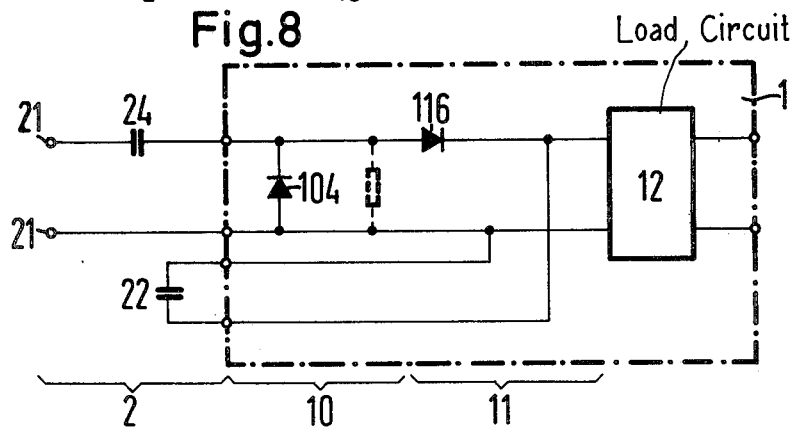

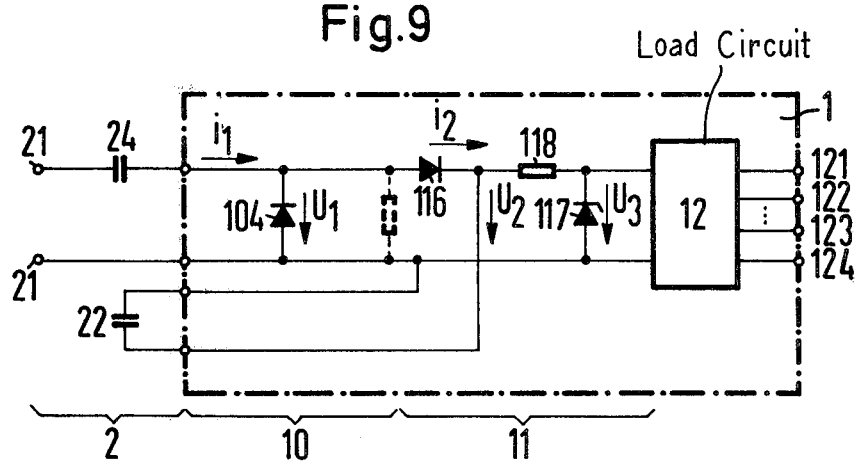
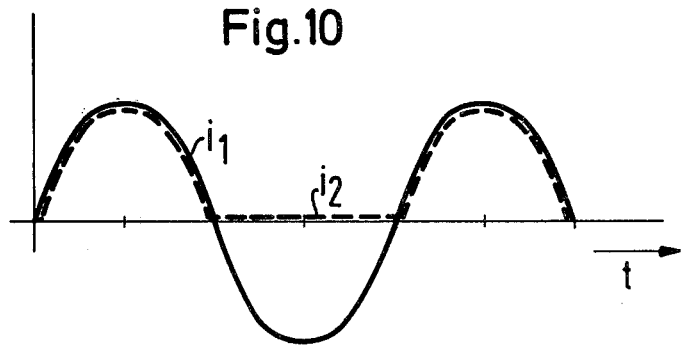
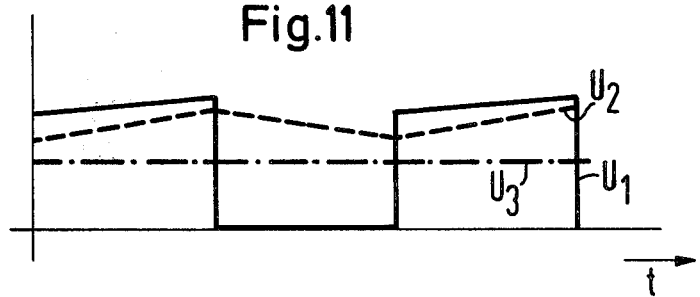

INTEGRATED CURRENT SUPPLY CIRCUITS

BACKGROUND OF THE INVENTION

1. Field of the Invention

The invention relates to a current supply circuit for use with integrated load circuits in which the current supply circuit has a rectifier circuit and a smoothing circuit.

2. Description of the Prior Art

Current supplies of this kind are known. Transformers, rectifiers and smoothing circuits are used in these known current supplies which are almost exclusively provided with discrete components.

In a number of large scale applications for individual integrated circuits such known circuits are too expensive for the current supply. This holds true, for example, for electronic applications in the consumer industry, in simple electrical household appliances, in Synchron watches, in extensions to home telephone equipment, in toys, and in installation technology. Therefore, electromechanical structures with discrete or integrated components are often preferred to entirely electronic structures for the above-mentioned reason.

SUMMARY OF THE INVENTION

An object of the present invention is to provide an inexpensive integrated current supply.

According to the invention, a current supply system is provided for operation of an integrated electrical load circuit such as for the application enumerated above wherein a semiconductor chip is provided on which the load circuit is integrated and wherein a current supply circuit is integrated on the same chip as the load circuit. The integrated current supply includes an integrated rectifier circuit, an integrated smoothing circuit connected to the rectifier circuit, and a smoothing circuit filter capacitor connected to the rectifier circuit. In view of the difficulty of integrating large capacitors, the filter capacitor is mounted external to the chip.

BRIEF DESCRIPTION OF THE DRAWINGS

FIG. 1 is a block circuit diagram illustrating an integrated current supply with rectifier and smoothing circuits on a semiconductor chip;

FIG. 2 is a block diagram illustrating an integrated current supply in which the rectifier, smoothing, stabilization, and load circuits are formed on a semiconductor chip;

FIG. 3 is a schematic diagram of an integrated rectifier circuit with an ohmic voltage divider;

FIG. 4 is a schematic diagram of an integrated smoothing circuit having an ohmic voltage divider;

FIG. 5 is a schematic diagram of an integrated circuit symmetrically structured voltage divider permitting the protection of an operator in case of unintentional contact with an output;

FIG. 6 is a schematic diagram of an integrated circuit;

FIG. 7 is a schematic diagram of an integrated current supply with a capacitive voltage divider;

FIG. 8 is a schematic diagram of an integrated current supply having a capacitive voltage divider and smoothing circuit;

FIG. 9 is a schematic diagram illustrating the chronological course of currents and voltages of the integrated circuit in accordance with FIG. 8; and FIGS. 10 and 11 are graphs illustrating the variation with time of voltages and currents in the circuit of FIG. 9.

DESCRIPTION OF THE PREFERRED EMBODIMENTS

The chip containing the rectifier, smoothing, and stabilization circuits is referenced 1 in FIG. 1. An external circuit connected with the chip 1 is referenced 2. At inputs 21 of external circuit 2 the external voltage source is connected. A rectifier circuit 10 and a smoothing and stabilization circuit 11 are arranged on the chip 1. The smoothing and stabilization circuit 11 has outputs 111, 112 . . . 114.

In the integrated current supply illustrated in FIG. 2, in addition to the rectifier circuit 10 and the smoothing and stabilization circuit 11, the load circuit 12 is also located on the chip 1. The load circuit 12 can receive its input signals at inputs 121 through 122 or through input transducers situated directly on the chip. The output signals of the load circuit can be transmitted as electric magnitudes via outputs 123 through 124 or via output transducers. Temperature sensors or light-sensitive elements, for example, can be utilized as such input transducers. Integrated luminescence diodes can be utilized in a hybrid manner, for example, on the semiconductor chip as output transducers.

FIG. 3 illustrates a simple embodiment of a rectifier circuit 10 having an ohmic voltage divider. The external circuitry 2 at whose inputs 21 the external voltage supply is connected, consists of a charge or filter capacitor 22. The integration of this capacitor on chip 1 is not possible as it would require too large an area. In greater outputs, i.e. outputs which are greater than about 1 watt, the drop resistance is preferably partitioned. It then comprises, as illustrated in FIG. 3 an external dropping resistor 23 and an internal resistor connected thereto in series. This internal resistor is integrated on the chip 1. As can be concluded from FIG. 3, the internal dropping resistor contained in the rectifier circuit 10 on the chip is the resistor 101 and the forward resistance of the series circuit of diodes 102. The dropping resistance, for example, can also solely consist of the forward resistance of the diodes 102 themselves.

As is obvious from FIG. 3, the one input terminal 21 of the external circuitry 2 is connected with the internal resistance 101, 102 of the rectifier circuit 10 via the external dropping resistance 23. The other connection of the internal resistance 101, 102 is connected with one input of the smoothing circuit 11. The other input of the smoothing circuit 11 is connected with the other terminal 21 of the external voltage source. In parallel to the inputs of the smoothing circuit 11 is the charge or filter capacitor 22 which is arranged in the external circuitry 2.

FIG. 4 illustrates a smoothing circuit 11 in conjunction with the circuit in accordance with FIG. 3. Details of FIG. 4 which were already described in conjunction with FIG. 3 bear corresponding reference symbols. By use of the smoothing circuit 11 the voltage in the charge or filter capacitor 22 is limited by the parallel-connected series circuit of zener diodes 111. The zener diodes function as part of the voltage divider. The actual smoothing circuit consists of a field effect transistor 112 limiting the output voltage in the resistance 113. In a manner obvious from the figure a series circuit consisting of a resistance 114 and at least one zener diode 115 is connected in parallel to the series circuit of the zener diodes 111. One end of the source and drain path of the field effect transistor 112 is connected at a junction of the series circuit of the zener diodes 111 and the series circuit of the resistance 114 and the zener diode 115. The gate connection of the transistor 112 is connected at a junction of resistance 114 and the zener diode 115. A resistance 113 is provided in parallel with output terminals 116, 117 of the smoothing circuit. The other end of the source-drain path of transistor 112 connects to output terminal 116.

FIG. 5 illustrates an integrated current supply in which the dropping resistance 23, 101, 102 of the voltage divider as shown in FIG. 4 is divided into two approximately equal resistance paths 23', 101', 102'. Such a circuit offers protection when the output terminals are touched, since the current I flowing across the touched terminals is limited to a small value in the most unfavorable case, when there is a contact between a line R of the mains or voltage supply and the ground point Mp.

FIG. 6 illustrates a current supply in which the rectifier circuit 10 comprises a Graetz or full-wave bridge circuit 103, known per se. In the manner obvious from the figure, the input of the bridge circuit is connected with the AC supply terminals 21. The output of the bridge circuit 103 is connected with the smoothing circuit 11, already described. In parallel to the output of the bridge circuit 103 lies the charge or filter capacitor 22 which is part of the external circuitry 2. Due to the utilization of the bridge circuit 103, a low capacitance is required for the charge or filter capacitor 22 for a given residual ripple of the voltage.

A capacitive voltage divider is provided in the current supply circuit illustrated in FIGS. 7 and 8. These circuits exhibit the advantage of low loss at the output. The rectifier circuit 10, the smoothing circuit 11 and the load circuit 12 are again arranged on the chip 1. The voltage supply terminals 21 are respectively connected with the rectifier circuit 10 situated on the chip 1. The external circuitry 2 consists of the series capacitor 24 connected between a terminal of the AC current source and an input connection of the rectifier circuit 10, and also of the charge or filter capacitor 22 of the smoothing circuit 11. The series capacitor 24 is connected in front of a shunt diode 104 situated on the chip 1 and the smoothing circuit 11 connected in parallel to this shunt diode 104. In the simplest case, the smoothing circuit 11 consists of a rectifier 116 in the series branch and of the charge or filter capacitor 22 in the shunt branch (FIG. 8). Conventional stabilization circuits with zener diodes and series transistors can be connected at the output side of this arrangement.

FIG. 9 illustrates such a circuit having a zener diode 117 connected at the output side. The function of this circuit is described in conjunction with FIGS. 10 and 11. The input voltage at the diode 104 on the chip 1 becomes very small vis-a-vis the connected AC voltage. The input on the chip 1 is therefore provided via the impressed current $I_1 = U \cdot 2\pi f \cdot C_{24}$. The negative half wave of this current $I_1$ is diverted via the diode 104 with a negligible decrease. The positive half wave is dropped, as illustrated in FIG. 10, via the rectifying diode 111 in the smoothing circuit.

The inventive integrated current supply having a capacitive voltage divider can also be provided in accordance with the circuit illustrated in FIG. 5 for the limitation of the current flowing in case of a short circuit.

The components of this invention integrated on the chip 1 of the current supply of this invention can be produced by various technologies. The integrated circuits 10, 11 and 12 on chip 1 can, for example, be carried out in ESFI-SOS (Epitaxial Silicon Film on Insulator-Silicon on Sapphire) technology; in beam-lead technology; in a technology having a polycrystalline silicon carrier (Harris method); or can be carried out in special technologies in solid silicon having high ohmic, thick epitaxy layers. Such technologies are known. However, alternative technologies with sufficient insulating properties can also be employed and used.

The ESFI-SOS technology and a technology in solid silicon having a high ohmic, thick epitaxy layer is particularly advantageous. However, such a technology cannot always be utilized as, for example, epitaxy layers with dopings of $10^{14} cm^{-3}$ (a specific resistance of about 100 ohm-cm) and epitaxy and diffusion depths of 25 $\mu m$ are required for operation from a 220 V AC voltage source since blocking voltages of more than 300 volts are required. These thicknesses and dopings are required for the blocking layer insulations utilized in solid silicon circuits.

Aside from the low power consumption, a particular advantage of the current supply having a capacitive voltage divider is that any one of the conventional integrated circuit technologies discussed above for the semiconductor chip 1 may be employed since the blocking voltage requirements lie in the conventional voltage range of between 10 and 30 V.

On the other hand, integrated current supplies having an ohmic voltage divider are advantageous for the reason that a smaller number of external circuit elements are required.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A current supply system for DC operation of an integrated load circuit comprising a semiconductor chip on which the load circuit is integrated, a current supply circuit means integrated on the same chip as the load circuit, said current supply circuit means including an integrated rectifier circuit, an integrated smoothing circuit connected to the rectifier circuit, and a smoothing circuit filter capacitor connected to the rectifier circuit, said current supply circuit means having AC supply mains input terminals and the circuit means being operable to convert an AC supply mains voltage to a DC supply voltage for the integrated load circuit.

2. A current supply system in accordance with claim 1, characterized in that the filter capacitor of the smoothing circuit is arranged external to the chip.

3. A current supply system in accordance with claim 1 characterized in that said current supply circuit means has an ohmic voltage divider formed of a first resistance and an integrated second resistance, the smoothing circuit being arranged in parallel to the second resistance.

4. A current supply system in accordance with claim 3, characterized in that the ohmic voltage divider comprises integrated rectifier diodes connected to one another in series and zener diodes connected to one another in series, and the smoothing circuit has a series circuit of a resistance and a zener diode which is arranged in parallel to the series connected zener diodes, a field effect transistor being provided with its source-drain path connected at a junction of the series connected resistance and zener diode and the series connected zener diodes, the junction between the series connected resistance and zener diode being connected with a gate of the field effect transistor, and the other end of the drain—source path of the field effect transistor being connected to a first output terminal of the smoothing circuit, a junction of the series connected resistance and zener diode and the series connected zener diodes being connected with a second output terminal of the smoothing circuit, and an additional resistance provided between the first and second output terminals of the smoothing circuit, the output voltage of the smoothing circuit being limited by the field effect transistor.

5. A current supply system in accordance with claim 3 characterized in that a dropping resistance is connected in series external to the chip in addition to the first resistance of the ohmic voltage divider.

6. A current supply system in accordance with claim 3, characterized in that the first resistance of the ohmic voltage divider is divided into two approximately equal parts, first and second inputs of the smoothing circuit being respectively connected with first and second supply voltage terminals by approximately one-half of the total desired dropping resistance in each case.

7. A current supply system in accordance with claim 1, characterized in that a bridge rectifier circuit is provided in which two oppositely situated connections of said bridge rectifier circuit are connected with first and second voltage supply terminals and one of two other oppositely situated connections of the bridge rectifier circuit are respectively connected with first and second input terminals of the smoothing circuit.

8. A current supply system in accordance with claim 1, characterized in that a capacitive voltage divider is provided, including a series capacitor external to the chip connected between a voltage supply terminal and an input connection of the integrated rectifier circuit, and a charge capacitor external to the chip connected in parallel to the smoothing circuit and the rectifier circuit includes a diode connected in parallel to the inputs of the smoothing circuit.

9. A current supply system in accordance with claim 8, characterized in that the smoothing circuit comprises a diode and the external charge-capacitor, that the diode is connected between a first input and a first output of the smoothing circuit, a second input of the smoothing circuit being connected with a second output of the smoothing circuit and said charge capacitor being arranged between outputs of the smoothing circuit.

10. A current supply system in accordance with claim 8, characterized in that a zener diode is provided as a stabilization circuit in parallel to outputs of the smoothing circuit.

11. A current supply system in accordance with claim 8, characterized in that a stabilization circuit is provided in parallel to outputs of the smoothing circuit, said stabilization circuit including an integrated series transistor.

12. A power supply system for DC operation of an integrated load circuit comprising a semiconductor chip on which the load circuit is integrated, a current supply circuit means having a first portion integrated on the same chip as the load circuit and a second portion external to the chip, said first portion including an integrated rectifier circuit and an integrated smoothing circuit connected to the rectifier circuit, and said second portion including a filter capacitor connected to an output of the rectifier circuit, said current supply circuit means connecting to an AC supply mains and operable to convert an AC supply mains voltage to a DC supply voltage for the integrated circuit.

13. The system of claim 12 in which said first portion further includes a zener diode connected in parallel to the smoothing circuit and said second portion further includes an external dropping resistor cooperating with a series resistance of diodes in the rectifier circuit to form a voltage divider with the zener diode.

14. A current supply system according to claim 1 wherein the current supply circuit means is operable with an AC supply mains voltage of 220 volts.

* * * * *